United States Patent
Xu et al.

(10) Patent No.: US 10,838,089 B2
(45) Date of Patent: Nov. 17, 2020

(54) APPARATUS, DEVICE AND METHOD FOR MEASURING BREAKDOWN VOLTAGE

(71) Applicant: ZHONGPAI S&T (SHENZHEN) CO., LTD, Shenzhen (CN)

(72) Inventors: Jianfeng Xu, Wuhan (CN); Zhixiang Zhao, Shanghai (CN); Qiu Huang, Shanghai (CN); Qiyu Peng, Wuhan (CN)

(73) Assignee: ZHONGPAI S&T (SHENZHEN) CO., LTD, Guangdong (CN)

( * ) Notice: Subject to any disclaimer, the term of this patent is extended or adjusted under 35 U.S.C. 154(b) by 308 days.

(21) Appl. No.: 16/004,304

(22) Filed: Jun. 8, 2018

(65) Prior Publication Data
US 2018/0292550 A1 Oct. 11, 2018

Related U.S. Application Data

(63) Continuation of application No. PCT/CN2016/107716, filed on Nov. 29, 2016.

(30) Foreign Application Priority Data

Dec. 11, 2015 (CN) .......................... 2015 1 0922640

(51) Int. Cl.
*G01T 7/00* (2006.01)
*G01R 31/14* (2006.01)
(Continued)

(52) U.S. Cl.
CPC ............... *G01T 7/00* (2013.01); *G01R 31/14* (2013.01); *G01R 31/2829* (2013.01);
(Continued)

(58) Field of Classification Search
CPC ......... G01T 7/00; G01T 1/208; G01T 1/2018; G01T 1/248; G01T 7/005
See application file for complete search history.

(56) References Cited

U.S. PATENT DOCUMENTS

| 9,164,144 B2 | 10/2015 | Dolinsky | |
| 2013/0327932 A1* | 12/2013 | Kim | A61B 6/03 250/252.1 |

(Continued)

FOREIGN PATENT DOCUMENTS

| CN | 102341727 A | 2/2012 |
| CN | 103389765 A | 11/2013 |

(Continued)

OTHER PUBLICATIONS

International Search Report and Written Opinion for International Application No. PCT/CN2016/107716 dated Mar. 8, 2017.

(Continued)

*Primary Examiner* — Mohammad K Islam
(74) *Attorney, Agent, or Firm* — Wolf, Greenfield & Sacks, P.C.

(57) ABSTRACT

An apparatus, device and method for measuring a breakdown voltage are disclosed. The apparatus comprises a controlled voltage source (122), a current detection circuit (124), and a processing circuit (126). The controlled voltage source (122) is used for providing a series of test bias voltages for the sensor unit (110). The current detection circuit (124) is used for detecting a current signal output by the sensor unit (110) and generating a corresponding detection signal. The processing circuit (126) is used for controlling the controlled voltage source (122) to provide a series of test bias voltages, calculating dark currents respectively corresponding to the series of test bias voltages on the basis of the detection signal, and determining a breakdown voltage of the sensor unit (110) on the basis of the series of test bias voltages and the dark currents.

14 Claims, 6 Drawing Sheets

(51) Int. Cl.
*G01T 1/208* (2006.01)
*G01T 1/20* (2006.01)
*G01R 31/28* (2006.01)
*G01T 1/24* (2006.01)

(52) U.S. Cl.
CPC ............ *G01T 1/208* (2013.01); *G01T 1/2018* (2013.01); *G01T 1/248* (2013.01)

(56) References Cited

U.S. PATENT DOCUMENTS

| | | | |
|---|---|---|---|
| 2014/0110573 A1* | 4/2014 | Wang | G01T 1/40 250/252.1 |
| 2015/0177394 A1* | 6/2015 | Dolinsky | G01T 7/005 250/252.1 |
| 2017/0018099 A1* | 1/2017 | Heukensfeldt Jansen | G06T 11/005 |
| 2017/0160129 A1* | 6/2017 | Viswanath | G01J 1/46 |
| 2018/0066986 A1* | 3/2018 | Kasai | G01J 1/42 |

FOREIGN PATENT DOCUMENTS

| | | |
|---|---|---|
| CN | 104180790 A | 12/2014 |
| CN | 104199502 A | 12/2014 |
| CN | 105548848 A | 5/2016 |

OTHER PUBLICATIONS

International Preliminary Report on Patentability for International Application No. PCT/CN2016/107716 dated Jun. 21, 2018.

Wu Baohong Thesis. Design of the Test Circuit for ADP System Parameters Based on ADL5317. A Thesis Submitted in Partial Fulfillment of the Requirement for the M.S. Degree in Circuit and System. May 2013; 54 pages.

\* cited by examiner

US 10,838,089 B2

APPARATUS, DEVICE AND METHOD FOR MEASURING BREAKDOWN VOLTAGE

RELATED APPLICATIONS

This Application is a Continuation of International Patent Application Serial No. PCT/CN2016/107716, filed on Nov. 29, 2016, entitled "APPARATUS, DEVICE AND METHOD FOR MEASURING BREAKDOWN VOLTAGE," which claims foreign priority benefits under 35 U.S.C. § 119(a)-(d) or 35 U.S.C. § 365(b) of Chinese Application No. 201510922640.2, filed on Dec. 11, 2015. Both of these applications are incorporated herein by reference in their entireties.

FIELD OF THE ART

The present invention relates to the field of circuits, and in particular, to an apparatus, device and method for measuring a breakdown voltage.

BACKGROUND

In high-energy photon (X-ray, gamma photons, etc.) measurement systems, photoelectric sensors such as a silicon photomultiplier (SiPM) are often used. The SiPM is a silicon-based photoelectric sensor. The SiPM consists of small sensor cells each with a side length of about 10 to 100 microns. Each sensor cell is an avalanche photodiode operating in a Geiger mode. Each sensor cell can only detect one visible photon every time. Hundreds of sensor cells form a sensor unit (pixels). The sensor unit generally has a size of 1 square millimeter to several tens of square millimeters. Hundreds of sensor units are combined together to form a large sensor array (for example, an array composed of 16×16 3 mm×3 mm sensor units). The SiPM array and a scintillation crystal array are coupled together via a photoconductive layer to form a SiPM-based front-end detector. The SiPM-based front-end detector is widely applied to the detection for high-energy photons. Compared to conventional photomultipliers (PMTs), the SiPM has the advantages of small size, low bias voltage, high time resolution, compatibility with a magnetic resonance imaging (MRI) magnetic field, and the like. The SiPM has a disadvantage that its gain is greatly affected by a temperature. The change in the gain of the SiPM has a great influence on many performances of the SiPM-based front-end detector and can affect the measurement results for high-energy photons. It is known to those skilled in the art that the gain of the sensor unit is generally proportional to its bias overvoltage, and the bias overvoltage is equal to a difference between a bias voltage and a breakdown voltage. Since the bias voltage is usually known, if a breakdown voltage of the sensor unit is measured, the gain variation condition of the sensor unit may be acquired, and the gain variation may be further compensated.

Therefore, it is desirable to provide an apparatus for measuring a breakdown voltage to at least partially solve the above problems existing in the prior art.

SUMMARY

In order to at least partially solve the problems existing in the prior art, according to an aspect of the present invention, there is provided an apparatus for measuring a breakdown voltage. The apparatus comprises a controlled voltage source, a current detection circuit and a processing circuit. An output end of the controlled voltage source is used for connecting to an input end of a sensor unit, and the controlled voltage source is used for providing a series of test bias voltages for the sensor unit. An input end of the current detection circuit is used for connecting to an output end of the sensor unit, and the current detection circuit is used for detecting a current signal output by the sensor unit and generating a corresponding detection signal. An input end of the processing circuit is connected to an output end of the current detection circuit, and an output end of the processing circuit is connected to an input end of the controlled voltage source. The processing circuit is used for controlling the controlled voltage source to provide the series of test bias voltages, calculating dark currents respectively corresponding to the series of test bias voltages on the basis of the detection signal, and determining a breakdown voltage of the sensor unit on the basis of the series of test bias voltages and the dark currents.

According to another aspect of the present invention, there is provided a device for measuring a breakdown voltage. The device comprises a plurality of apparatuses for measuring a breakdown voltage as described above, which are in one-to-one correspondence with a plurality of sensor units in a sensor array.

According to yet another aspect of the present invention, there is provided a device for measuring a breakdown voltage. The device comprises a controlled voltage source, a voltage control circuit, and a plurality of current detection circuits and a plurality of processing circuits which are in one-to-one correspondence with a plurality of sensor units in a sensor array. An output end of the controlled voltage source is used for connecting to input ends of the plurality of sensor units respectively, and the controlled voltage source is used for providing a series of test bias voltages for the plurality of sensor units. An output end of the voltage control circuit is connected to an input end of the controlled voltage source, and the voltage control circuit is used for controlling the controlled voltage source to provide the series of test bias voltages. An input end of each of the plurality of current detection circuits is used for connecting to an output end of a corresponding sensor unit, and each of the plurality of current detection circuits is used for detecting a current signal output by the corresponding sensor unit and generating a corresponding detection signal. An input end of each of the plurality of processing circuits is connected to an output end of the current detection circuit and an output end of the voltage control circuit; and each of the plurality of processing circuits is used for calculating dark currents respectively corresponding to the series of test bias voltages on the basis of the detection signal, and determining a breakdown voltage of the corresponding sensor unit on the basis of the series of test bias voltages and the dark currents.

According to yet another aspect of the present invention, there is provided a method for measuring a breakdown voltage. The method comprises the following steps: providing a series of test bias voltages for a sensor unit; detecting a current signal output by the sensor unit and generating a corresponding detection signal; calculating dark currents respectively corresponding to the series of test bias voltages on the basis of the detection signal; and determining a breakdown voltage of the sensor unit on the basis of the series of test bias voltages and the dark currents.

According to the apparatus, device and method for measuring the breakdown voltage provided by the embodiments of the present invention, the breakdown voltage of the sensor unit is calculated on the basis of the series of bias voltages provided by the controlled voltage source controlled by the processing circuit and the series of dark currents correspondingly obtained from the current detection circuit. The structure of the circuit provided by the embodiments of the present invention is simple. The breakdown voltage of the sensor unit can be calculated rapidly, accurately and efficiently. The change in the gain of the sensor unit can be compensated accurately in time.

A series of simplified concepts are introduced in the summary of the present invention and will be further described in detail in the detailed description. The summary of the present invention is not intended to attempt to limit the key features and the necessary technical features of the claimed technical solution, nor to attempt to limit the protection scope of the claimed technical solution.

The advantages and features of the present invention will be described in detail below with reference to the accompanying drawings.

BRIEF DESCRIPTION OF THE DRAWINGS

The following drawings of the present invention are incorporated herein as a part of the present invention for understanding the present invention. The drawings illustrate the embodiments of the present invention and their description to explain the principle of the present invention. In the drawings.

DETAILED DESCRIPTION

In the following description, lots of details are provided in order to thoroughly understand the present invention. However, those skilled in the art may understand that the following description only involves the preferred embodiments of the present invention, and they may be implemented without one or more of these details. In addition, some technical features that are well known in the art are not described in order to avoid confusion with the present invention.

Figure 1:
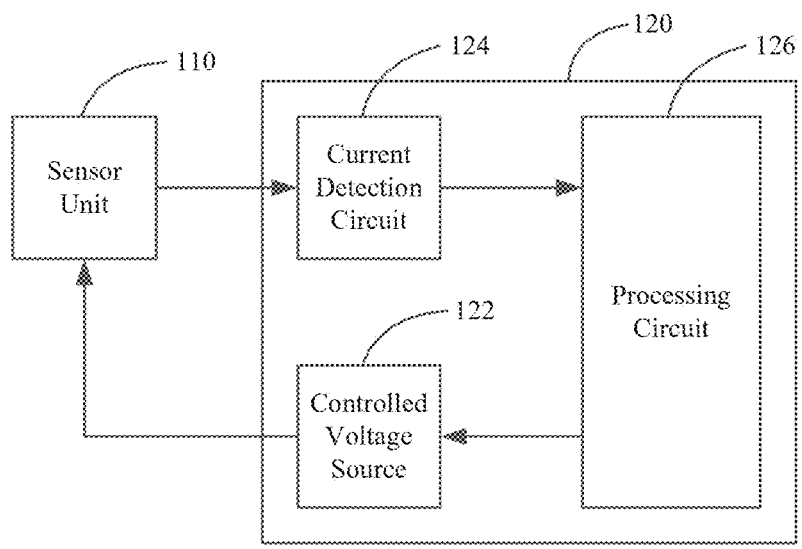
FIG. 1 illustrates a schematic block diagram of a sensor unit and an apparatus for measuring a breakdown voltage according to an embodiment of the present invention.

According to an aspect of the present invention, an apparatus for measuring a breakdown voltage is provided. FIG. 1 illustrates a schematic block diagram of a sensor unit 110 and an apparatus 120 for measuring a breakdown voltage according to an embodiment of the present invention. As shown in FIG. 1, the apparatus 120 for measuring the breakdown voltage comprises a controlled voltage source 122, a current detection circuit 124 and a processing circuit 126.

An output end of the controlled voltage source 122 is connected to an input end of the sensor unit 110. The controlled voltage source 122 is used for providing a series of test bias voltages for the sensor unit 110. An input end of the current detection circuit 124 is connected to an output end of the sensor unit 110. The current detection circuit 124 is used for detecting a current signal output by the sensor unit 110 and generating a corresponding detection signal. An input end of the processing circuit 126 is connected to an output end of the current detection circuit 124. An output end of the processing circuit 126 is connected to an input end of the controlled voltage source 122. The processing circuit 126 is used for controlling the controlled voltage source 122 to provide the series of test bias voltages, calculating dark currents respectively corresponding to the series of test bias voltages on the basis of the detection signal, and determining a breakdown voltage of the sensor unit on the basis of the series of test bias voltages and the dark currents.

The controlled voltage source 122 is controlled by the processing circuit 126, which output a bias voltage having a certain voltage value to the sensor unit 110 under the control of the processing circuit 126. For example, the controlled voltage source may output a 30V operating bias voltage to the sensor unit 110, such that the sensor unit 110 enters into a normal operating state. The controlled voltage source 122 may be, for example, an oscilloscope.

The current detection circuit 124 may be any suitable circuit capable of detecting a current signal output by the sensor unit 110. For example, the current detection circuit 124 may include an oscilloscope for detecting the current signal and performing some desired processing on the current signal. It may be understood that the current detection circuit 124 detects the current signal output by the sensor unit 110 during a breakdown voltage measurement period. During this breakdown voltage measurement period, either an effective event(s) or a dark event(s) may occur, or no any event may occur. In a period in which no event occurs, the current signal output by the sensor unit 110 is 0, and the detection signal generated by the current detection circuit 124 is also 0.

In this text, an effective event refers to an event in which a current signal is generated in a sensor unit, which is caused by high-energy photons (e.g., gamma photons, etc.) acts in a scintillation crystal connected to the sensor unit. A dark event refers to an event in which a current signal is generated in the sensor unit, which is caused by noise (generally hot electrons). The sensor unit 110 may output a pulse current signal when an effective event or a dark event occurs. For convenience of description, in this text, a pulse current signal output by the sensor unit 110 when the effective event occurs is referred to as an effective current signal (i.e., an effective current), and a pulse current signal output by the sensor unit 110 when the dark event occurs is referred to as a dark current signal (i.e., a dark current). Energy of the effective current signal is much higher than energy of the dark current signal. The former is typically tens to thousands of times higher than the latter. Therefore, whether an effective event or a dark event occurs in the sensor unit 110 may be determined by analyzing the energy of the current signal output by the sensor unit 110.

The processing circuit 126 may be a digital circuit with a data processing capability. In this case, the processing circuit 126 may be programmed to implement various calculation functions. Optionally, the processing circuit 126 may be implemented with a field programmable gate array (FPGA), a digital signal processor (DSP), a complex programmable logic device (CPLD), a micro-control unit (MCU), or a central processing unit (CPU).

When it is desired to acquire the breakdown voltage of the sensor unit 110, the apparatus 120 may be used for measurement. The basic operating principle of the apparatus 120 is to obtain a series of dark currents by constantly changing the bias voltage applied to the sensor unit 110. The breakdown voltage of the sensor unit may be determined on the basis of the magnitudes of the dark currents at different bias voltages. In addition, a bias overvoltage (equal to the bias voltage minus the breakdown voltage) of the sensor unit may be further determined. Since the bias overvoltage is generally proportional to a gain of the sensor unit 110, the bias overvoltage may reflect the magnitude of the gain of the sensor unit 110. The apparatus 120 may be started every once in a while, for example every 10 minutes. The apparatus 120 may measure the breakdown voltage of the sensor unit 110 in a short period of time. This period of time may be set as desired, for example, set as 10 seconds. During this period of time, the processing circuit 126 may control the controlled voltage source 122 to output a series of different bias voltages, i.e., a series of test bias voltages, thereby obtaining a series of dark currents. Since the starting interval of the apparatus 120 is relatively short, the temperature may change little or be almost unchanged between two starts, so the temperature may be considered to be constant, such that the breakdown voltage (and gain) of the sensor unit 110 between the two starts may be considered to be constant. If the apparatus 120 is started once every 10 minutes, the breakdown voltage (and gain) currently measured by the apparatus 120 may be considered as the breakdown voltage (and gain) in the next 10 minutes.

According to the apparatus for measuring the breakdown voltage provided by the embodiment of the present invention, the breakdown voltage of the sensor unit is calculated on the basis of the series of bias voltages provided by the controlled voltage source controlled by the processing circuit and the series of dark currents correspondingly obtained from the current detection circuit. A circuit provided by the embodiment of the present invention is simple in structure. The breakdown voltage of the sensor unit can be calculated rapidly, accurately and efficiently. The change in the gain of the sensor unit can be compensated accurately in time.

Optionally, the processing circuit 126 controls the controlled voltage source 122 to provide the series of test bias voltages in the following manner: if a dark current corresponding to a currently provided test bias voltage is out of a dark current range, controlling the controlled voltage source to provide a new test bias voltage until a dark current corresponding to a finally provided test bias voltage is within the dark current range, wherein the dark current range is determined on the basis of a known dark current corresponding to a known breakdown voltage. The processing circuit 126 determines the breakdown voltage of the sensor unit in the following manner: determining the finally provided test bias voltage as the breakdown voltage of the sensor unit 110.

The dark current range is related to the known dark current corresponding to the known breakdown voltage. For example, it is assumed that the known breakdown voltage is 25 V and the known dark current corresponding thereto is 1 nA, the dark current range may be set to be in a range from 0.9 nA to 1.1 nA. 0.9 nA is a lower threshold of the dark current range, and 1.1 nA is an upper threshold of the dark current range. When a dark current is higher than or equal to 0.9 nA and lower than or equal to 1.1 nA, it is considered that the dark current is within the dark current range, and the bias voltage in this case may be considered as the breakdown voltage. On the contrary, when a dark current is lower than 0.9 nA or higher than 1.1 nA, it is considered that the dark current is out of the dark current range, and the bias voltage in this case may not be considered as the breakdown voltage. It may be understood that, for a sensor unit, the breakdown voltage thereof may change with a temperature, but the dark current corresponding to the breakdown voltage may be substantially constant. For example, the breakdown voltage may change from 25 V to 26 V, but the corresponding dark current may always be 1 nA. In this way, for a sensor unit, it is possible to initially measure a dark current corresponding to a breakdown voltage thereof once and then determine a dark current range of the sensor unit. The dark current range may be used every time the breakdown voltage is measured. The dark current range may be set to an appropriate range as required, for example, to be relatively narrow to improve the determination accuracy of the breakdown voltage.

In addition, the breakdown voltage may also be determined according to the magnitude of the change in the dark current when the test bias voltage changes. For example, it is assumed that the initial test bias voltage is set as a value lower than the current breakdown voltage. Since the initially measured dark current is lower than the lower threshold of the dark current range, it is necessary to gradually increase the test bias voltage. The corresponding dark current is measured every time the test bias voltage increases. If an increased test bias voltage is still lower than the current breakdown voltage, the magnitude of the measured dark current will change little compared with that of the dark current corresponding to the previous test bias voltage. If an increased test bias voltage is higher than the current breakdown voltage, the magnitude of the dark current will change significantly compared with that of the dark current corresponding to the previous test bias voltage (lower than the current breakdown voltage). In this case, it may be determined that the current breakdown voltage is between the increased test bias voltage and the test bias voltage before it increases.

Any suitable test bias voltage may be selected to begin the test every time the apparatus 120 is started and a series of different test bias voltages is provided. In this case, there may be the following two conditions. (1) If the dark current obtained by the test is lower than the lower threshold of the dark current range, it is indicated that the breakdown voltage at this time is higher than the current test bias voltage. Next, the apparatus 120 may gradually increase the test bias voltage and detect the dark current until the dark current is within the dark current range, and the test bias voltage provided at this time is the breakdown voltage. (2) If the dark current obtained by the test is higher than the upper threshold of the dark current range, it is indicated that the breakdown voltage at this time is lower than the current test bias voltage. Next, the apparatus 120 may gradually reduce the test bias voltage and detect the dark current until the dark current is within the dark current range, and the test bias voltage provided at this time is the breakdown voltage. According to the present embodiment, the breakdown voltage of the sensor unit may be accurately determined.

Optionally, the initially provided test bias voltage in the series of test bias voltages is equal to the known breakdown voltage.

Every time the apparatus 120 is started and a series of different test bias voltages is provided, a last measured breakdown voltage, i.e., the known breakdown voltage, may be selected to begin the test. As described above, the apparatus 120 may be started once every 10 minutes. In this way, a breakdown voltage may be measured every 10 minutes. The difference between two breakdown voltages obtained respectively in two measurements is generally not too large. In the next measurement of the breakdown voltage, the known breakdown voltage may be purposely used as the initial test bias voltage. In this way, the measurement time may be shortened and the current breakdown voltage may be quickly determined.

Optionally, the processing circuit 126 may control the controlled voltage source 122 to provide new test bias voltages in the following manner: controlling the controlled voltage source 122 to provide the new test bias voltages with a variable voltage step size.

As described above, every time it is determined that the dark current is out of the dark current range, it is necessary to provide a new test bias voltage, that is, to adjust the value of the test bias voltage. The processing circuit 126 may uniformly control the controlled voltage source 122 to provide new test bias voltages, that is, to make the test bias voltage change by the same amount every time. For example, if the current breakdown voltage is 25.5V and the initial test bias voltage is 25V, it is possible to increase the test bias voltage by 0.1V each time. In this way, the current breakdown voltage may be determined by six measurements.

In practical applications, more efficient breakdown voltage determination methods may also be used. According to the present embodiment, the test bias voltages are provided with a variable voltage step size to determine the breakdown voltage more quickly. For example, the manner of providing the test bias voltages with the variable voltage step size may be a dichotomy. The principle of the dichotomy may be illustrated as below. It is assumed that the current breakdown voltage is 25.5V and the initial test bias voltage is 25V. If the dark current is found to be lower than the lower threshold of the dark current range when the breakdown voltage is measured for the first time, the test bias voltage may be adjusted to 26V, and the dark current is found to be higher than the upper threshold of the dark current range. Then, the test bias voltage may be adjusted to (25V+26V)/2, i.e., 25.5V, and the dark current at this time is just within the dark current range, which means that the test bias voltage at this time is equal to the breakdown voltage. In this way, the current breakdown voltage may be determined only by three measurements. Therefore, compared to the manner in which the voltage step size is invariable, the manner in which the voltage step size is variable is more efficient, and the breakdown voltage of the sensor unit may be determined more quickly.

Optionally, the processing circuit 126 determines the breakdown voltage of the sensor unit in the following manner: determining the breakdown voltage of the sensor unit 110 on the basis of a relationship curve between the series of test bias voltages and the dark currents.

A method for determining a breakdown voltage is described below by reference to FIG. 2.

Figure 2:
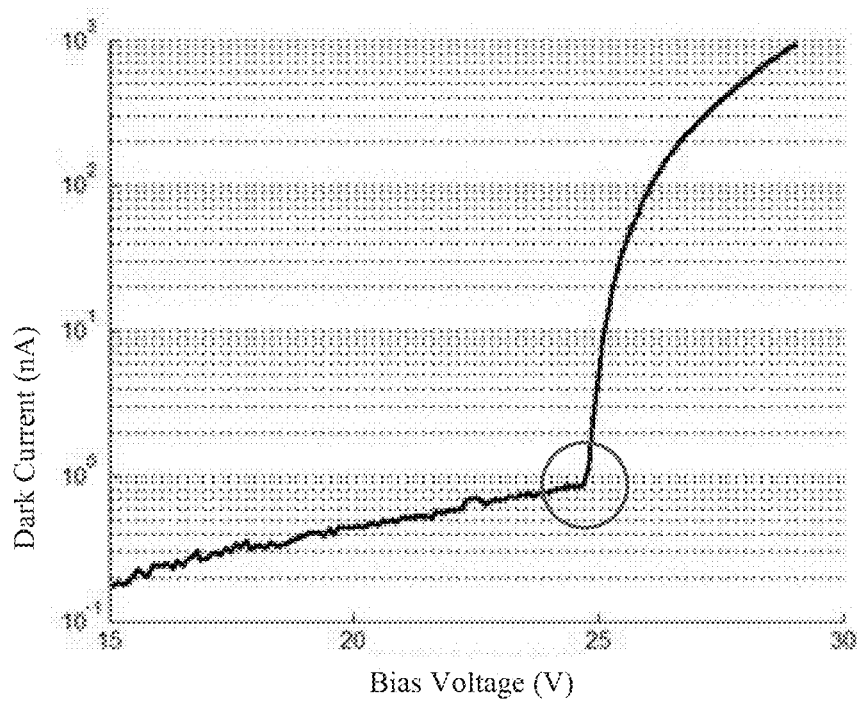
FIG. 2 illustrates a relationship curve between bias voltages and dark currents according to an embodiment of the present invention.

FIG. 2 illustrates a relationship curve between bias voltages and dark currents according to an embodiment of the present invention. In FIG. 2, a position where the breakdown voltage is located is marked with a circle. As can be clearly seen from FIG. 2, the dark current is relatively stable when the bias voltage is lower than 25V, and slowly increases with the increase of the bias voltage. When the bias voltage approaches 25V, the dark current rapidly increases. Therefore, there is a clear turning point in the relationship curve, which may be called an inflection point. This inflection point is the location where the breakdown voltage is located. Therefore, in the embodiment shown in FIG. 2, the breakdown voltage is about 25V. The breakdown voltage is a breakdown voltage at the current temperature. It may be understood that, for different sensor units, the breakdown voltages at the same temperature may also be different because the performances of the sensor units may be different.

The method for determining the breakdown voltage based on the relationship curve between the bias voltages and the dark currents is simple and convenient. In the case where the breakdown voltage of the sensor unit is completely unknown, it is relatively effective to measure the breakdown voltage of the sensor unit in this way.

Optionally, the maximum test bias voltage in the series of test bias voltages is equal to a predetermined voltage upper limit, and the minimum test bias voltage in the series of test bias voltages is equal to a predetermined voltage lower limit. The predetermined voltage upper limit and the predetermined voltage lower limit may be determined as required. For example, it is assumed that the current temperature is 25° C.; it is empirically known that the breakdown voltage at 25° C. is generally 25V. The value of the bias voltage may change in the vicinity of 25V, for example, from 23V to 27V, and values of a series of dark currents are measured at the same time. In this way, the predetermined voltage upper limit may be 27V, and the predetermined voltage lower limit may be 23V. Optionally, the predetermined voltage upper limit is equal to the maximum breakdown voltage of the sensor unit 110 or 3100, and the predetermined voltage lower limit is equal to the minimum breakdown voltage of the sensor unit 110 or 3100. Generally, the maximum breakdown voltage and the minimum breakdown voltage of the sensor unit are known for each high-energy photon measurement system. For example, when a manufacturer produces the measurement system, it generally performs some tests on the system and records relevant parameters of the system. These parameters generally include the maximum breakdown voltage and the minimum breakdown voltage of the sensor unit. Therefore, the variation range of the test bias voltage may be set to a range from the minimum breakdown voltage to the maximum breakdown voltage of the sensor unit. In this way, when the breakdown voltage is measured, it is not necessary to set the variation range of the bias voltage to be larger and measure the corresponding dark currents, such that the measurement efficiency may be improved and the influence on the normal operation of the sensor unit may be reduced.

Figure 3:
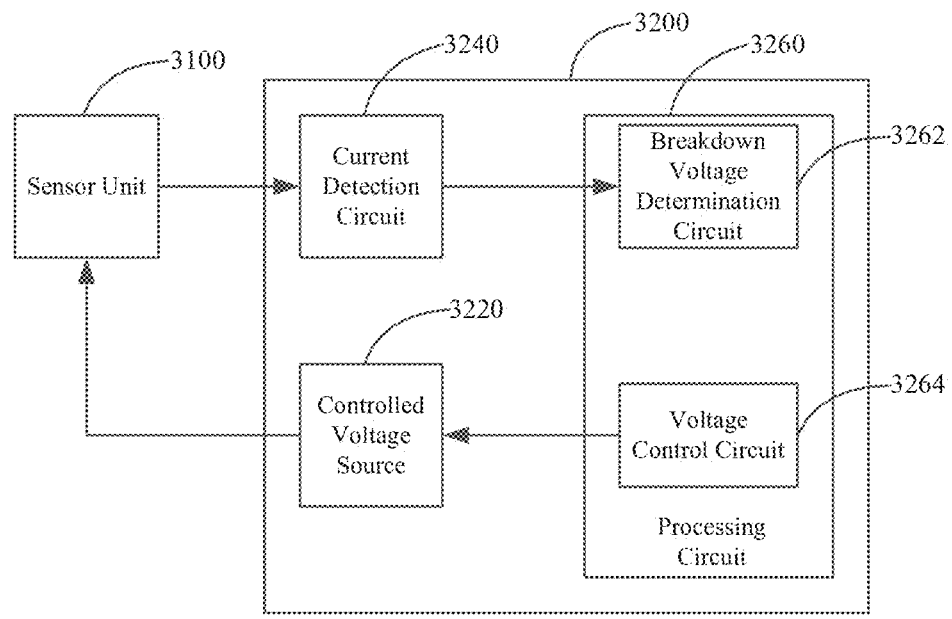
FIG. 3 illustrates a schematic block diagram of a sensor unit and an apparatus for measuring a breakdown voltage according to another embodiment of the present invention.

FIG. 3 illustrates a schematic block diagram of a sensor unit 3100 and an apparatus 3200 for measuring a breakdown voltage according to another embodiment of the present invention. The sensor unit 3100, a controlled voltage source 3220, a current detection circuit 3240 and a processing circuit 3260 shown in FIG. 3 correspond to the sensor unit 110, the controlled voltage source 122, the current detection circuit 124 and the processing circuit 126 shown in FIG. 1, and will not be described here again. In the present embodiment, the processing circuit 3260 may further comprise a breakdown voltage determination circuit 3262 and a voltage control circuit 3264. The breakdown voltage determination circuit 3262 is used for calculating dark currents respectively corresponding to a series of test bias voltages on the basis of a detection signal, and determining a breakdown voltage of the sensor unit 3100 on the basis of the series of test bias voltages and the dark currents. The voltage control circuit 3264 is used for controlling the controlled voltage source 3220 to provide the series of test bias voltages.

As known from the above description, the processing circuit 3260 may be a digital circuit with a data processing capability. Therefore, both the breakdown voltage determining circuit 3262 and the voltage control circuit 3264 may be implemented with digital circuits. For example, either of the breakdown voltage determination circuit 3262 or the voltage control circuit 3264 may be implemented with an FPGA, a DSP, a CPLD, an MCU, or a CPU. The functions of the breakdown voltage determination circuit 3262 and the voltage control circuit 3264 may be implemented with the digital circuit such as the FPGA being programmed. The breakdown voltage determination circuit 3262 and the voltage control circuit 3264 may be implemented with separate circuits to facilitate the management and maintenance of the circuits.

Optionally, the processing circuit 126 or 3260 may comprise a transmitting interface. The controlled voltage source 122 or 3220 may comprise a receiving interface. The processing circuit 126 or 3260 may be further used for transmitting a control command to the receiving interface via the transmitting interface, and the control command is used for controlling the controlled voltage source 122 or 3220 to provide the series of test bias voltages. The transmitting interface and the receiving interface may be communications interfaces which are matched with each other for assisting the processing circuit 126 or 3260 to transmit instructions or information to the controlled voltage source 122 or 3220. For example, the transmitting interface and the receiving interface may be universal serial bus (USB) interfaces.

Optionally, the apparatus 120 or 3200 for measuring the breakdown voltage described above is started when the sensor unit 110 or 3100 is in a non-operating state.

After a high-energy photon measurement system is started, the breakdown voltage of the sensor unit 110 or 3100 may be measured before the sensor unit 110 or 3100 enters into a normal operating state. Or, the breakdown voltage of the sensor unit 110 or 3100 may be measured when the sensor unit 110 or 3100 is in an interval between two normal operating states, i.e., in an idle state. Since it is necessary to adjust the bias voltage of the sensor unit 110 or 3100 when the breakdown voltage thereof is measured, the measurement of the breakdown voltage when the sensor unit 110 or 3100 is in a non-operating state, can avoid the interference to the normal operation of the sensor unit 110 or 3100.

Optionally, the processing circuit 126 or 3260 may be further used for calculating a difference between the breakdown voltage and a known breakdown voltage, calculating a sum of a known bias voltage and the difference to obtain a target bias voltage, and controlling the controlled voltage source 122 or 3220 to provide the target bias voltage as an operating bias voltage of the sensor unit 110 or 3100.

After the current breakdown voltage is determined, the change in the gain may be compensated by the method provided by the present embodiment. The principle of the present embodiment is to offset the change in the gain caused by the change in the breakdown voltage by synchronously changing the operating bias voltage and the breakdown voltage of the sensor unit.

Specifically, it is assumed that the known breakdown voltage is $Vb_0$ and the known bias voltage is $V_0$, the gain of the sensor in this case reaches a desired gain. Further, it is assumed that the currently measured breakdown voltage is $Vb_0 + \Delta V$, which indicates that the breakdown voltage is increased by $\Delta V$ at this time. Then, the current operating bias voltage may be set as $V_0 + \Delta V$. Since the bias overvoltage of the sensor unit is equal to the difference between the bias voltage and the breakdown voltage, the bias overvoltage of the sensor unit may be kept constant by the above-mentioned manner, such that the gain of the sensor unit may be kept constant. Therefore, when the current breakdown voltage has been measured, the gain of the sensor unit may be stabilized by adjusting the operating bias voltage in synchronization with the breakdown voltage, that is, the change in the gain may be compensated.

Optionally, the processing circuit 126 or 3260 may be further used for calculating a specific bias overvoltage of the sensor unit on the basis of the breakdown voltage and a specific bias voltage, and determining a gain of the sensor unit at the specific bias voltage on the basis of the specific bias overvoltage.

As described above, the gain of the sensor unit such as a SiPM is generally proportional to the bias overvoltage of the sensor unit. In addition, the bias overvoltage is equal to the difference between the bias voltage and the breakdown voltage. The breakdown voltage of the sensor unit is very sensitive to a temperature. When the bias voltage of the sensor unit is constant and the temperature rises, the breakdown voltage of the sensor unit increases, the bias overvoltage decreases, and the gain decreases. Constant temperature and unstable bias voltage may also cause significant change in the gain of the sensor unit. For example, if the temperature is constant, the breakdown voltage of the sensor unit does not change, but the bias voltage decreases, then the bias overvoltage may decrease and the gain may decrease too. Therefore, both the temperature and the bias voltage may cause significant change in the gain of the sensor unit.

At a specific temperature and a specific bias voltage, if the breakdown voltage at this time is known, the bias overvoltage may be calculated. Generally, the corresponding relationship between the gain and the bias overvoltage of the sensor unit is determined in advance. The processing circuit 126 or 3260 may maintain a relationship table which describes the relationship between the gain and the bias overvoltage. It may be understood that the relationship between the gain and the bias overvoltage is linear, but the change in the cross talk rate with the gain may be considered in the relation table. Therefore, the influence of the gain and the cross talk rate on the energy of the effective event may be simultaneously compensated according to a non-linear relation table. When a bias overvoltage is calculated, the gain corresponding to the bias overvoltage may be looked up from the maintained relation table.

It is assumed that the operating bias voltage of the sensor unit during normal operation is 30V. In the case where the breakdown voltage is determined to be 25V according to the relationship curve as shown in FIG. 2, it may be calculated that the bias overvoltage is the difference between 30V and 25V, i.e., 5V, when the sensor unit operates normally. Subsequently, the gain corresponding to the 5V bias overvoltage may be looked up from the known relationship table of the gain and the bias overvoltage. Of course, a relation expression of the gain and the bias overvoltage may also be established on the basis of theory or experience. The gain may be directly calculated using this relation expression.

Optionally, the specific bias voltage is the operating bias voltage. The processing circuit 126 or 3260 may be further used for correcting an energy $E_0$ of an effective event detected by the sensor unit 110 or 3100 according to the following formula: $E = E_0 * G_0 / G$, in which, E is the corrected energy, G is the gain of the sensor unit 110 or 3100 at the operating bias voltage, and $G_0$ is a predetermined constant.

The process of correcting the energy of the effective event is also the process of compensating the change in the gain. After the gain of the sensor unit is determined, the influence from the change in the gain may be compensated on the basis of the gain.

In this text, the gain G of the sensor unit, which may change with time, may be calculated in real time. $G_0$ may also be any suitable value, which is not limited herein.

For example, $G_0$ may be equal to, for example, the standard gain described above. By comparing the gain of the sensor unit measured at the current moment with the standard gain, the difference between the energy of the effective event measured at the current moment and the energy at the standard gain may be acquired, such that the energy measured at the current moment may be corrected as the energy at the standard gain. If all energy of a plurality of sensor units is corrected in this way, it is equivalent to making the energy of the plurality of sensor units be based on the same standard, such that their energy may be compared with each other. For example, if the standard gain is 100 and the gain G measured at the current moment is 200, it is indicated that the gain at the current moment is doubled. Therefore, the measured energy may also be twice as much as the energy at the standard gain. If the measured energy $E_0$ is 2000, the corrected energy E may be 1000.

In addition, the energy of the sensor unit may also be corrected to an actual energy. In this case, $G_0$ may be set to 1. For example, if the relative value of the measured energy of the effective event is 1000 and the gain of the sensor unit is 10, 1000 may be divided by 10 to obtain 100. 100 may be considered as the actual relative value of the energy of the effective event. The gain compensation process may also be implemented in the processing circuit 126 or 3260. The processing circuit 126 or 3260 is a digital circuit, and the actual energy may be calculated simply and conveniently by programming. In this way, there is no need to add more hardware.

Optionally, the controlled voltage source 122 or 3220 may be further used for providing the operating bias voltage for the sensor unit 110 or 3100. The processing circuit 126 or 3260 may be further used for controlling the controlled voltage source 122 or 3220 to provide the operating bias voltage, calculating an effective current on the basis of the detection signal and calculating the energy of the effective event on the basis of the effective current.

The controlled voltage source 122 or 3220 provides the operating bias voltage for the sensor unit 110 or 3100, such that the sensor unit 110 or 3100 enters a normal operating state. In this way, the processing circuit 126 or 3260 may calculate the effective current on the basis of the detection signal output by the current detection circuit 124 or 3240. The effective current is generated when photons are incident on the sensor unit 110 or 3100, and may reflect the magnitude of the energy of the effective event. The energy of the effective event may be measured by the apparatus 120 or 3200 provided by the embodiment of the present invention. By means of this solution, additional hardware is not needed, the circuit integration level is high, the cost is low, and the computational efficiency is high. It may be understood that, in the processing circuit 126 or 3260, the measurement of the gain and the measurement of the energy of the effective event may be simultaneously implemented by different modules, and the correction of the energy of the effective event based on the gain may also be implemented.

Figure 4:
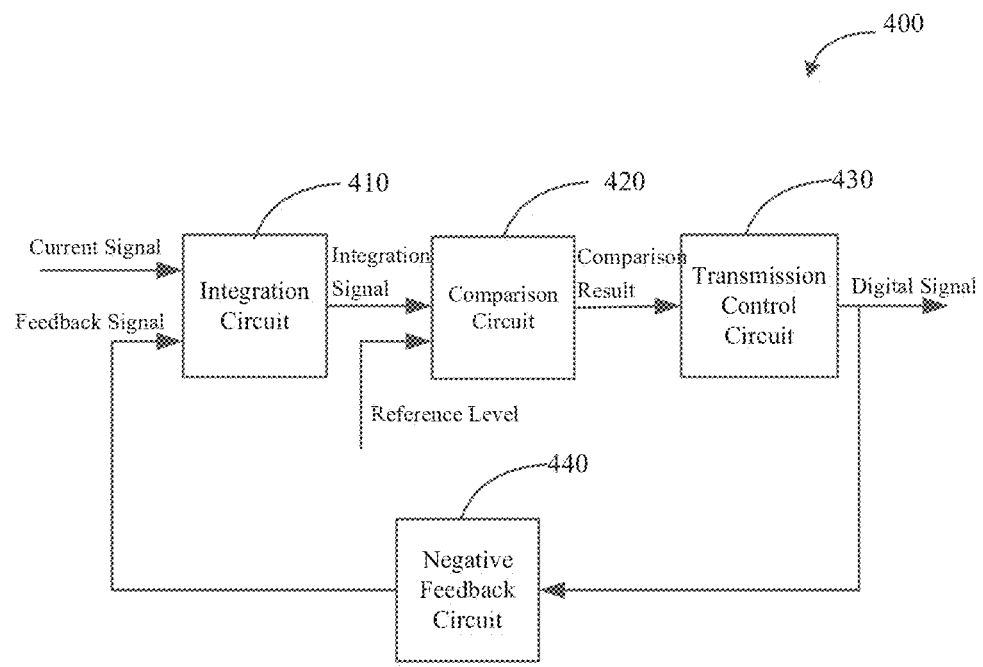
FIG. 4 illustrates a schematic block diagram of a current detection circuit according to an embodiment of the present invention.

Optionally, the detection signal is a digital signal. The digital signal consists of high and low levels which are equal in duration. The sum of all high levels in the digital signal is directly proportional to the integration of the current signal over time. In an example, the current detection circuit may be implemented in a form shown in FIG. 4 to generate the above-mentioned digital signal. FIG. 4 illustrates a schematic block diagram of a current detection circuit 400 according to an embodiment of the present invention.

The current detection circuit 400 may comprise an integration circuit 410, a comparison circuit 420, a transmission control circuit 430, and a negative feedback circuit 440.

The integration circuit 410 is connected to an output end of a sensor unit (e.g. the sensor unit 110 shown in FIG. 1) and an output end of the negative feedback circuit 440. The integration circuit 410 is used for receiving a current signal from the sensor unit and a feedback signal from the negative feedback circuit 440, integrating a difference between the current signal and the feedback signal and outputting an integration signal.

The current detection circuit 400 is a circuit including a negative feedback loop. The feedback signal is input to the integration circuit 410. At the same time, the integration circuit 410 also receives the current signal from the sensor unit. The current signal and the feedback signal flow in opposite directions. For example, if the current signal flows from the integration circuit 410 to the sensor unit, the feedback signal may be set to flow from the negative feedback circuit 440 to the integration circuit 410. Therefore, for the integration circuit 410, the difference between the current signal and the feedback signal is actually input at last, and the integration circuit 410 may integrate the difference therebetween. It should be noted that the direction of an arrow shown in FIG. 4 is a transmission direction of a signal, but not necessarily a flow direction of the signal. The integration circuit 410 may be implemented with an analog integration circuit, such as a filter circuit composed of a resistor and a capacitor.

As shown in FIG. 4, one input end of the comparison circuit 420 is connected to an output end of the integration circuit 410, and the other input end of the comparison circuit 420 is connected to a reference level. The comparison circuit 420 is used for comparing the integration signal with the reference level to generate a comparison result. For example, the comparison circuit 420 may output a high level when the amplitude of the integration signal is larger than the reference level, and may output a low level when the amplitude of the integration signal is equal to or less than the reference level. Therefore, only two states, i.e., the high level and the low level may exist in the comparison result output by the comparison circuit 420. Generally, the current signal output by the sensor unit is a pulse current signal that changes with time. In this case, the integration signal is also a time-dependent signal. Therefore, the comparison result output by the comparison circuit 420 is a signal that is switched between the high level and the low level with time.

An input end of the transmission control circuit 430 is connected to an output end of the comparison circuit 420. The transmission control circuit 430 is used for controlling the transmission of the comparison result using a clock signal so as to output a digital signal. As described above, the comparison result is a signal which is switched between the high level and the low level with time. In this comparison result, the durations of the high level and the low level may change in real time and may be too difficult to be determined. Therefore, the comparison result may be quantized based on time by the transmission control circuit 430, such that the duration of each section of consecutive high level or low level is of an integral multiple of a period of a clock signal. This quantization based on time is equivalent to time discretization in an analog-to-digital conversion process. Therefore, the whole of the comparison circuit 420 and the transmission control circuit 430 may be regarded as a 1-bit ADC from a functional perspective. In the digital signal output by the transmission control circuit 430, the durations of each high level and each low level are the same and equal to the period of the clock signal respectively. In an example, the high level may represent the logic level "1", and the low level may represent the logic level "0". Then the digital signal is a sequence of the logic levels "1" and "0". It is assumed that the frequency of the clock signal is 100 Hz, i.e., the period thereof is 0.01 s, the duration of single "1" or "0" in the digital signal is 0.01 s. In addition, it may be understood that when a plurality of "1" or a plurality of "0" appear continuously, the duration of the plurality of "1" or the plurality of "0" is of an integral multiple of 0.01s. The transmission control circuit 430 may be a register, a switching circuit controlled by the clock signal, or the like.

An input end of the negative feedback circuit 440 is connected to an output end of the transmission control circuit 430. The negative feedback circuit 440 is used for converting the digital signal into a feedback signal and feeding the feedback signal back to the integration circuit 410. The negative feedback circuit 440 may comprise a digital-to-analog converter (DAC) which is used for performing digital-to-analog conversion on the digital signal, to convert it to an analog signal. Specifically, the DAC may be a 1-bit DAC to convert the sequence consisting of "1" and "0" output from the transmission control circuit 430 to an analog signal, for example, to a voltage signal whose amplitude changes with time. The negative feedback circuit 440 may further comprise a resistor. The DAC is connected to an input end of the integration circuit 410 via this resistor. Therefore, a current signal flowing through the resistor, i.e., the feedback signal, is generated based on the voltage signal. The feedback signal may offset a part of the current signal from the sensor unit, so as to prevent the amplitude of the integration signal output by the integration circuit 410 from being too large, to keep the circuit stable. In addition, since the feedback signal continuously offsets the current signal from the sensor unit, an accumulated value of the feedback signal induced by the current signal may be regarded as an accumulated value of the current signal from the sensor unit. At the same time, the amplitude of the feedback signal is directly proportional to the amplitude of the digital signal. Therefore, when the duration of the current signal has ended and the amplitude of the feedback signal has been stabilized at zero (i.e., the negative feedback action for the current signal has ceased), energy of photons may be calculated by using the digital signal. It should be noted that the amplitude of the feedback signal should not be too large or too small. If the amplitude of the feedback signal is too large, the offset speed for the current signal is too fast, such that the error contained in the digital signal increases, which affects the measurement accuracy. On the contrary, if the amplitude of the feedback signal is too small, the offset speed for the current signal is too slow, such that the size of the integration signal may not be reduced in time, which also affects the measurement accuracy. The amplitude of the feedback signal may be determined according to actual needs, and will not be limited in the present invention.

The processing circuit 126 or 3260 may calculate the dark current based on "1" in the digital signal. For example, "1" may be accumulated or counted. As described above, the event occurring in the sensor unit 110 or 3100 may be an effective event or a dark event, and the difference between the energy of the effective event and the dark event is large. If there is no event, there may be a plurality of (for example, five or more) consecutive "0" in the digital signal. When "1" suddenly appears, it is indicated that an event occurs. Then "1" in the digital signal may be accumulated or counted until a plurality of (for example, five or more) consecutive "0" appear again. A value is obtained at the end of the event. This value may reflect the magnitude of the energy of the event. Whether the event is an effective event or a dark event may be distinguished according to this value. For example, if this value is on the order of tens to several hundreds, the event may be considered as a dark event. If the value is on the order of thousands, the event may be considered as an effective event. It is assumed that the event is determined to be a dark event and the calculated value is 200, then this value 200 may be considered as the relative energy of the dark event, and may also represent a relative value of the dark current. However, according to the above description with respect to FIG. 4, it may be seen that the digital signal is converted into the feedback signal that offsets the current signal from the sensor unit. Therefore, based on the magnitude of the feedback current and the value 200, the offset dark current may be calculated to acquire an absolute value of the dark current.

Figure 5:
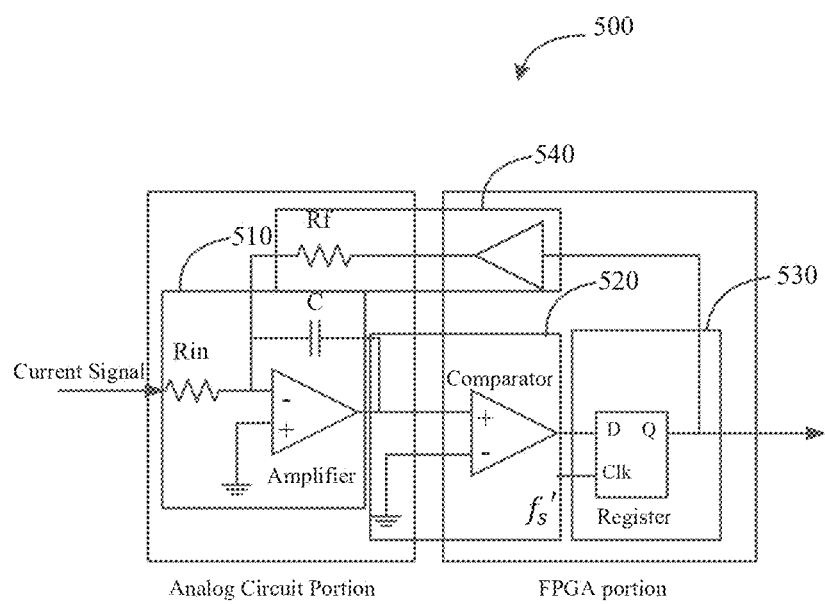
FIG. 5 illustrates a schematic circuit diagram of a current detection circuit according to an embodiment of the present invention.

FIG. 5 illustrates a schematic circuit diagram of a current detection circuit 500 according to an embodiment of the present invention. The current detection circuit 500 may comprise an integration circuit 510, a comparison circuit 520, a transmission control circuit 530, and a negative feedback circuit 540.

The integration circuit 510 may be implemented with an operational amplifier, a resistor Rin, and a capacitor C. The comparison circuit 520 may be implemented with a comparator. A reference level of the comparison circuit 520 is the ground level. The transmission control circuit 530 may be implemented with a register formed by a D flip-flop. The clock signal of the transmission control circuit 530 has a frequency of $f_s'$. The negative feedback circuit 540 may be implemented with a DAC and a resistor Rf. The DAC may be a pin of a field programmable gate array (FPGA). The whole current detection circuit 500 may be implemented with an analog circuit portion and an FPGA portion. As required, a diode may also be added to the circuit, or a voltage divider circuit may be used to reduce or block a bias direct current that may exist in the circuit. As shown in FIG. 5, those skilled in the art may understand the principle and the operation way of the current detection circuit 500 according to the above description of the current detection circuit 400, which will not be described here again.

A digitized detection signal is generated to facilitate the subsequent calculation for the energy of the effective event or the dark event.

Figure 6:
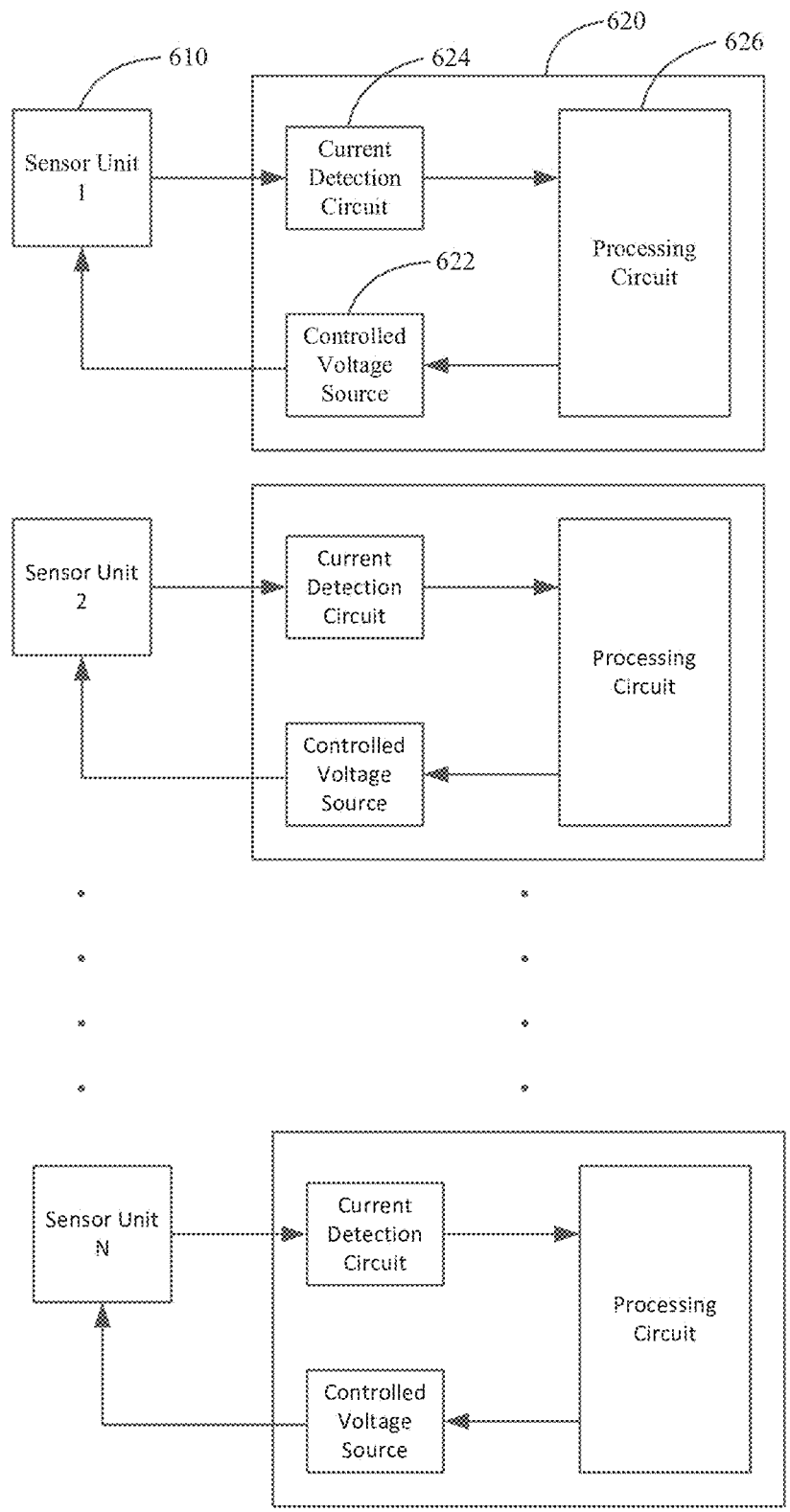
FIG. 6 illustrates a schematic block diagram of a sensor array and a device for measuring breakdown voltages according to an embodiment of the present invention.

According to another aspect of the present invention, there is provided a device for measuring a breakdown voltage. The device comprises a plurality of apparatuses for measuring a breakdown voltage described above, which are in one-to-one correspondence with a plurality of sensor units in a sensor array. FIG. 6 illustrates a schematic block diagram of a sensor array and a device for measuring a breakdown voltage according to an aspect of the present invention.

As shown in FIG. 6, the sensor array comprises N sensor units 610, namely a sensor unit 1, a sensor unit 2, . . . , and a sensor unit N. The device for measuring the breakdown voltage comprises N apparatuses 620 for measuring the breakdown voltage, which are in one-to-one correspondence with the N sensor units. Each apparatus 620, the same as the apparatus 120 described above, comprises a controlled voltage source 622, a current detection circuit 624, and a processing circuit 626. Those skilled in the art can understand the structure, operation way and advantages of the device for measuring the breakdown voltage according to the above description of the apparatus for measuring the breakdown voltage and by reference to FIGS. 1 to 5, which will not be repeat again.

It should be noted that, in the device for measuring the breakdown voltage, each processing circuit 626 may be implemented with the digital circuit such as the FPGA as described above. It may be understood that any number of processing circuits 626 in the device for measuring the breakdown voltage may be integrated in the same digital circuit such as the FPGA.

Optionally, the processing circuit 626 may be further used for calculating all or part of energy $E_0$ of an effective event detected by a corresponding sensor unit according to a detection signal, and correcting the energy $E_0$ according to the following formula: $E=E_0*G_0/G$, in which, E is the corrected energy, G is a gain of the corresponding sensor unit, and $G_0$ is a predetermined constant. Optionally, $G_0$ is a standard gain of the corresponding sensor unit of each processing circuit 626. For a sensor array, the standard gain of each sensor unit is generally the same.

As described above, the processing circuit 626 may be used for calculating a specific bias overvoltage of a corresponding sensor unit on the basis of the breakdown voltage and a specific bias voltage, and determining a gain of the corresponding sensor unit at the specific bias voltage on the basis of the specific bias overvoltage. The specific bias voltage may be the operating bias voltage. In this way, after the gain is calculated, the change in the gain may be compensated.

The following description will be made by reference to the SiPM. The gain of a SiPM unit is generally directly proportional to a bias overvoltage thereof. The bias overvoltage is equal to a difference between a bias voltage and a breakdown voltage. Due to the microelectronic process, the breakdown voltages of different SiPM units have certain differences. When the same series of SiPM units form a SiPM array, the same bias (operating) voltage is generally used. Since the breakdown voltage of all SiPM units is slightly different, their gains are also different. The difference between the gains of the SiPM units in the SiPM array may affect the performance of a front-end detector composed of the SiPM array. Generally, the SiPM units that form the SiPM array need to be tested and screened. The SiPM units whose breakdown voltages are different slightly are selected to form the SiPM array. In this way, the production cost of the SiPM array is increased, and the gain between every two SiPM units in the SiPM array is also difficult to be completely consistent. Therefore, the gain of each SiPM unit in the SiPM array may be measured in real time, and the consistency of the gains of SiPM units may be ensured by a gain compensation method.

The expression "$G_0/G$" in the above formula $E=E_0*G_0/G$ realizes the normalization of the gains of the sensor units in the same sensor array, such that the consistency of the gains of the sensor units may be ensured. For example, the gains of three sensor units in the same sensor array may be 1, 1.5, and 0.8, respectively. Therefore, for effective events whose energy is the same, the energy detected by each sensor unit may be different. However, it is desirable that the energy detected by the three sensor units is the same. Therefore, when the energy is subsequently corrected (that is, the change in the gain is compensated), the constant $G_0$ is first divided by 1, 1.5, and 0.8, respectively, which is equivalent to performing gain normalization. $G_0$ may be determined as required. After energy correction, the influence of the difference between the gains of the sensor units on energy measurement has been eliminated for the whole sensor array.

According to another aspect of the present invention, there is provided a device for measuring breakdown voltages. The device comprises a controlled voltage source, a voltage control circuit, a plurality of current detection circuits and a plurality of processing circuits. The plurality of current detection circuits and the plurality of processing circuits are in one-to-one correspondence with a plurality of sensor units in a sensor array.

An output end of the controlled voltage source is connected to input ends of the plurality of sensor units respectively. The controlled voltage source is used for providing a series of test bias voltages for the plurality of sensor units. An output end of the voltage control circuit is connected to an input end of the controlled voltage source. The voltage control circuit is used for controlling the controlled voltage source to provide the series of test bias voltages. An input end of each of the plurality of current detection circuits is connected to an output end of a corresponding sensor unit. Each of the plurality of current detection circuits is used for detecting a current signal output by the corresponding sensor unit and generating a corresponding detection signal. An input end of each of the plurality of processing circuits is connected to an output end of the current detection circuit and an output end of the voltage control circuit. Each of the plurality of processing circuits is used for calculating dark currents respectively corresponding to the series of test bias voltages on the basis of the detection signal, and determining a breakdown voltage of the corresponding sensor unit on the basis of the series of test bias voltages and the dark currents.

Figure 7:
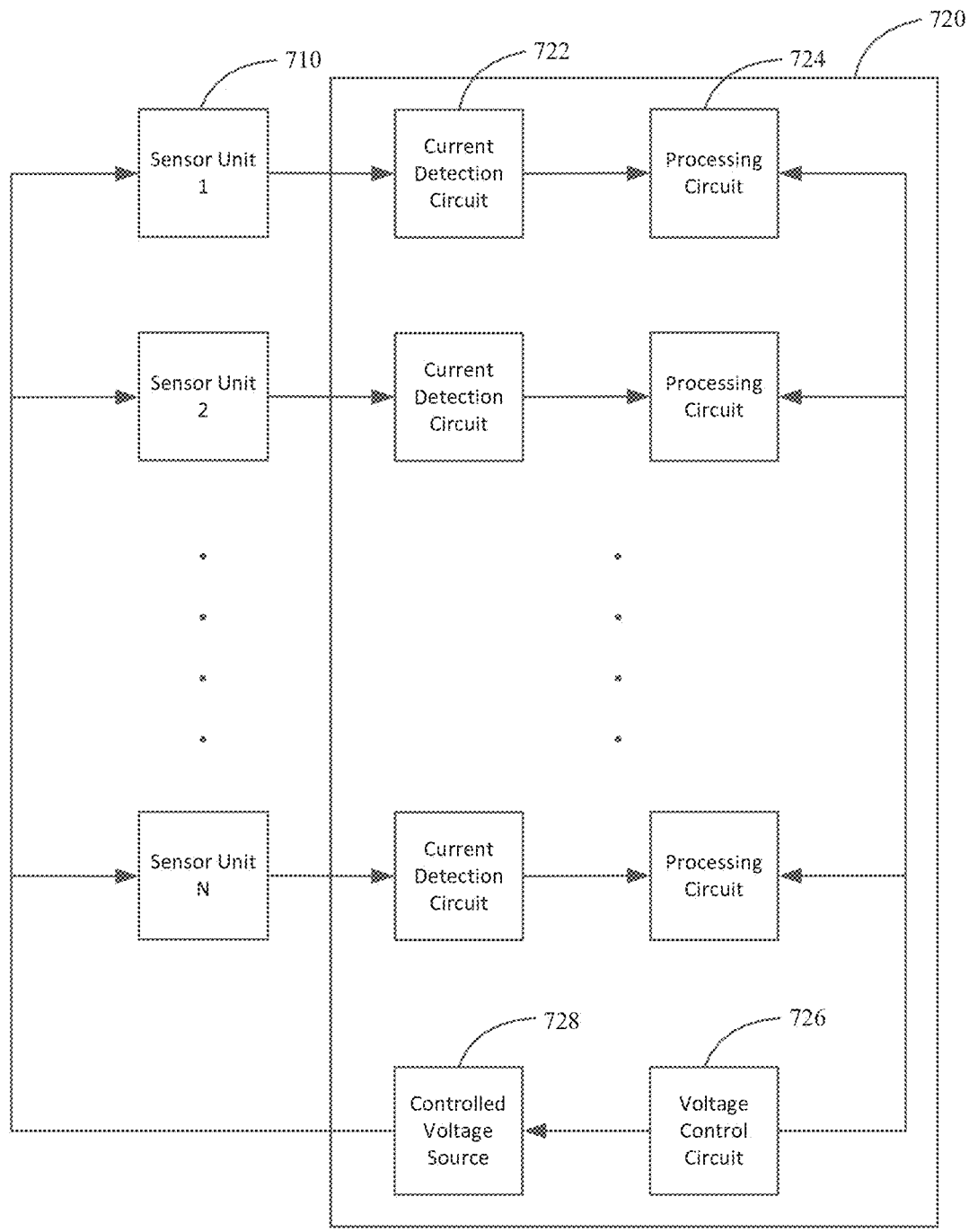
FIG. 7 illustrates a schematic block diagram of a sensor array and a device for measuring breakdown voltages according to another embodiment of the present invention.

FIG. 7 illustrates a schematic block diagram of a sensor array and a device for measuring breakdown voltages according to another embodiment of the present invention.

As shown in FIG. 7, the sensor array comprises N sensor units 710, i.e., a sensor unit 1, a sensor unit 2, . . . , a sensor unit N. The device 720 for measuring the breakdown voltages comprises N current detection circuits 722 and processing circuits 724, which are in one-to-one correspondence with N sensor units, and a voltage control circuit 726 and a controlled voltage source 728. Each of the current detection circuits 722 and each of the processing circuits 724 in the device 720 are respectively the same as the current detection circuit 624 and the processing circuit 626 in the embodiment shown in FIG. 6, and will not be described again. The controlled voltage source 728 in the device 720 is a separate voltage source, and the N sensor units 710 share this voltage source. Correspondingly, the voltage control circuit 726 may be configured to control the controlled voltage source 728 to provide a bias voltage. Each processing circuit 724 is connected to the voltage control circuit 726 to acquire the bias voltage applied to the corresponding sensor unit.

It may be understood that, in the device for measuring the breakdown voltages shown in FIG. 6, since each sensor unit uses a respective controlled voltage source, a separate breakdown voltage measurement may be performed for each sensor unit. In this way, the test bias voltage provided for each sensor unit may be freely determined according to situations and is not limited by other sensor units. Therefore, in this case, for each sensor unit, the initial test bias voltage may be its own known breakdown voltage, and the test bias voltage may be provided in a manner of a variable voltage step size. In the device for measuring the breakdown voltages shown in FIG. 7, since all sensor units share the same controlled voltage source, the sensor units may use the same test bias voltage. In this case, it is more prefer to determine the breakdown voltage on the basis of a relationship curve between the bias voltages and the dark currents.

It may be understood that the voltage control circuit 726 may be implemented with a digital circuit having a data processing capability. In addition, the block diagram shown in FIG. 7 is only an example. The voltage control circuit 726 may be integrated with any number of processing circuits 726, such as in the same digital circuit such as an FPGA.

Figure 8:
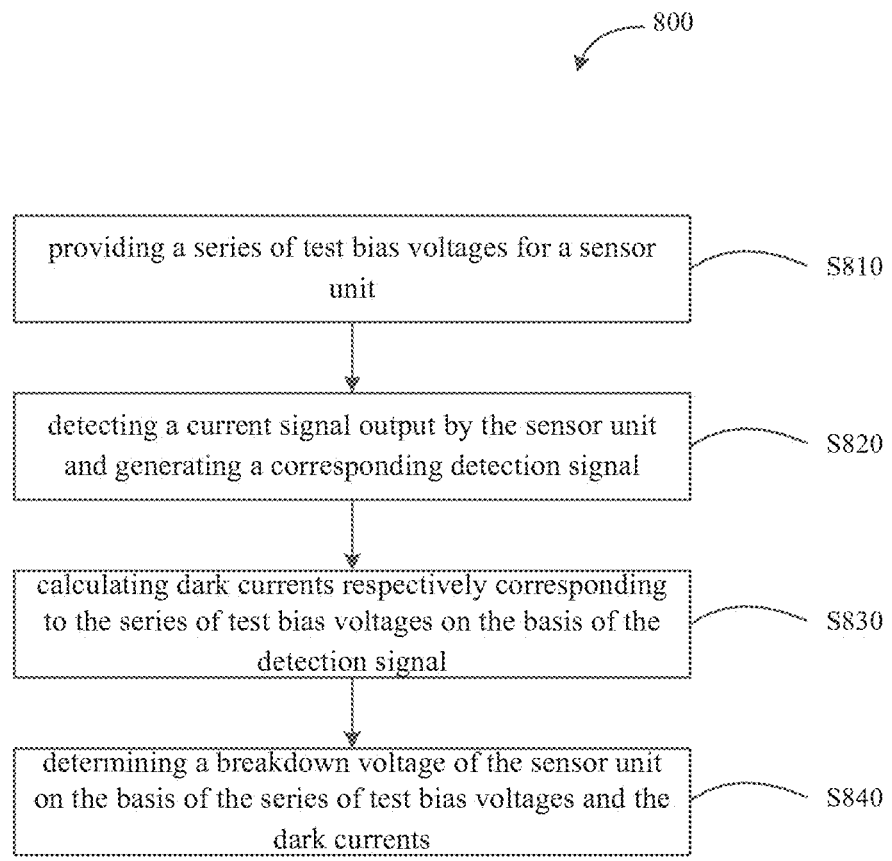
FIG. 8 shows a flowchart of a method for measuring a breakdown voltage according to an embodiment of the present invention.

According to another aspect of the present invention, there is provided a method for measuring a breakdown voltage. FIG. 8 illustrates a flowchart of a method 800 for measuring a breakdown voltage according to an embodiment of the present invention. As shown in FIG. 8, the method 800 comprises the following steps:

Step S810, providing a series of test bias voltages for a sensor unit;

Step S820, detecting a current signal output by the sensor unit and generating a corresponding detection signal;

Step S830, calculating dark currents respectively corresponding to the series of test bias voltages on the basis of the detection signal; and Step S840, determining a breakdown voltage of the sensor unit on the basis of the series of test bias voltages and the dark currents.

Those skilled in the art can understand the implement, the advantages and the like of the method 800 for measuring the breakdown voltage disclosed herein according to the above description of the apparatus for measuring a breakdown voltage and by reference to FIGS. 1 to 5, which will not be repeated here again for clarity.

The existing gain compensation methods for SiPM generally include: a temperature control method, a temperature compensation method and a spectrum peak tracking method.

(1) In the temperature control method, the temperature of the SiPM is directly stabilized by a temperature measurement and control system, thereby stabilizing a gain of the SiPM. This method requires a high-cost constant temperature system to be constructed. In many cases, this method is not feasible due to physical space limitations.

(2) In the temperature compensation method, a bias voltage is adjusted according to a change in a temperature to stabilize the gain of the SiPM. For example, as the temperature increases, the bias voltage may be increased to stabilize the gain. Ideally, this method requires a temperature measurement and voltage control circuit to be designed for each SiPM unit in the SiPM array. In practical applications, a group of SiPM units with close physical spaces may share a temperature measurement and voltage control circuit. This method is the most widely used but costly.

(3) In the spectrum peak tracking method, the gain is automatically calibrated by finding and tracking a photopeak position of an energy spectrum detected by the SiPM when an effective event occurs. The accuracy of this method depends on the speed of temperature drift and the effective event rate. To achieve accurate positioning of spectrum peaks at a certain temperature, more events are needed to overcome statistical errors. Under general circumstances (e.g., PET human imaging), the effective event rate is very low, and it is difficult to track photopeaks in real time.

Compared with the existing gain compensation method, the circuit provided by the embodiments of the present invention for measuring the breakdown voltage according to the dark currents and compensating the gain is simple in structure, low in cost, and easy to implement. In addition, since the dark event rate in the sensor unit is high, a large amount of reference data may be obtained in a shorter period of time, such that the breakdown voltage of the sensor unit may be determined quickly, accurately, and efficiently, which is advantageous for subsequent compensation for the change in the gain of the sensor unit.

Although the principles and applications of the embodiments of the present invention are described herein with reference to SiPM, it should be understood that the present invention is not limited thereto. The apparatus and method for measuring the breakdown voltage provided by the embodiments of the present invention may also be applied to a PMT or any other suitable photoelectric sensor.

The present invention has been described with reference to the above embodiments, but it should be understood that the above described embodiments are for purposes of illustration and description only and are not intended to limit the present invention to the scope of the described embodiments. In addition, those skilled in the art may understand that the present invention is not limited to the foregoing embodiments, and more various variations and modifications may be made based on the teachings for the present invention. These variations and modifications fall within the scope of the present invention. The protection scope of the present invention is defined by the appended claims and their equivalent scopes.

What is claimed is:

1. An apparatus for measuring a breakdown voltage, comprising a controlled voltage source, a current detection circuit and a processing circuit, wherein:

an output end of the controlled voltage source is used for connecting to an input end of a sensor unit, and the controlled voltage source is used for providing a series of test bias voltages for the sensor unit;

an input end of the current detection circuit is used for connecting to an output end of the sensor unit, and the current detection circuit is used for detecting a current signal output by the sensor unit and generating a corresponding detection signal;

an input end of the processing circuit is connected to an output end of the current detection circuit; an output end of the processing circuit is connected to an input end of the controlled voltage source; the processing circuit is used for controlling the controlled voltage source to provide the series of test bias voltages, calculating dark currents respectively corresponding to the series of test bias voltages on the basis of the detection signal, and determining a breakdown voltage of the sensor unit on the basis of the series of test bias voltages and the dark currents, the processing circuit is further used for calculating a specific bias overvoltage of the sensor unit on the basis of the breakdown voltage and a specific bias voltage, and determining a gain of the sensor unit at the specific bias voltage on the basis of the specific bias overvoltage, wherein the specific bias voltage is an operating bias voltage;

the processing circuit is further used for correcting an energy $E_0$ of an effective event detected by the sensor unit according to the following formula:

$$E=E_0*G_0/G,$$

in which, E is the corrected energy, G is the gain of the sensor unit at the operating bias voltage, and $G_0$ is a predetermined constant.

2. The apparatus according to claim 1, wherein,
the processing circuit controls the controlled voltage source to provide the series of test bias voltages in the following manner:
if a dark current corresponding to a currently provided test bias voltage is out of a dark current range, controlling the controlled voltage source to provide a new test bias voltage until a dark current corresponding to a finally provided test bias voltage is within the dark current range, wherein the dark current range is determined on the basis of a known dark current corresponding to a known breakdown voltage;
the processing circuit determines the breakdown voltage of the sensor unit in the following manner:
determining the finally provided test bias voltage as the breakdown voltage of the sensor unit.

3. The apparatus according to claim 2, wherein an initially provided test bias voltage in the series of test bias voltages is equal to the known breakdown voltage.

4. The apparatus according to claim 2, wherein the processing circuit controls the controlled voltage source to provide new test bias voltages in the following manner:
controlling the controlled voltage source to provide the new test bias voltages with a variable voltage step size.

5. The apparatus according to claim 1, wherein the processing circuit determines the breakdown voltage of the sensor unit in the following manner:
determining the breakdown voltage of the sensor unit on the basis of a relationship curve between the series of test bias voltages and the dark currents.

6. The apparatus according to claim 5, wherein a maximum test bias voltage in the series of test bias voltages is equal to a predetermined voltage upper limit, and a minimum test bias voltage in the series of test bias voltages is equal to a predetermined voltage lower limit.

7. The apparatus according to claim 6, wherein the predetermined voltage upper limit is equal to a maximum breakdown voltage of the sensor unit, and the predetermined voltage lower limit is equal to a minimum breakdown voltage of the sensor unit.

8. The apparatus according to claim 1, wherein the processing circuit further comprises a breakdown voltage determination circuit and a voltage control circuit, wherein,
the breakdown voltage determination circuit is used for calculating the dark currents respectively corresponding to the series of test bias voltages on the basis of the detection signal, and determining the breakdown voltage of the sensor unit on the basis of the series of test bias voltages and the dark currents;
the voltage control circuit is used for controlling the controlled voltage source to provide the series of test bias voltages.

9. The apparatus according to claim 1, wherein the processing circuit comprises a transmitting interface; the controlled voltage source comprises a receiving interface; the processing circuit is further used for transmitting a control command to the receiving interface via the transmitting interface; the control command is used for controlling the controlled voltage source to provide the series of test bias voltages.

10. The apparatus according to claim 1, wherein the apparatus is started when the sensor unit is in a non-operating state.

11. The apparatus according to claim 1, wherein the processing circuit is further used for calculating a difference between the breakdown voltage and a known breakdown voltage, calculating a sum of a known bias voltage and the difference to obtain a target bias voltage, and controlling the controlled voltage source to provide the target bias voltage as an operating bias voltage of the sensor unit.

12. The apparatus according to claim 1, wherein, the controlled voltage source is further used for providing the operating bias voltage for the sensor unit; the processing circuit is further used for controlling the controlled voltage source to provide the operating bias voltage, calculating an effective current on the basis of the detection signal, and calculating the energy of the effective event on the basis of the effective current.

13. A device for measuring breakdown voltages, comprising a plurality of apparatuses for measuring a breakdown voltage according to claim 1, which are in a one-to-one correspondence with a plurality of sensor units in a sensor array.

14. A device for measuring breakdown voltages, comprising a controlled voltage source, a voltage control circuit, and a plurality of current detection circuits and a plurality of processing circuits which are in one-to-one correspondence with a plurality of sensor units in a sensor array, wherein:
an output end of the controlled voltage source is used for connecting to input ends of the plurality of sensor units respectively, and the controlled voltage source is used for providing a series of test bias voltages for the plurality of sensor units;
an output end of the voltage control circuit is connected to an input end of the controlled voltage source, and the voltage control circuit is used for controlling the controlled voltage source to provide the series of test bias voltages;
an input end of each of the plurality of current detection circuits is used for connecting to an output end of a corresponding sensor unit, and each of the plurality of current detection circuits is used for detecting a current signal output by the corresponding sensor unit and generating a corresponding detection signal;
an input end of each of the plurality of processing circuits is connected to an output end of the current detection circuit and an output end of the voltage control circuit; each of the plurality of processing circuits is used for calculating dark currents respectively corresponding to the series of test bias voltages on the basis of the detection signal, and determining a breakdown voltage of the corresponding sensor unit on the basis of the series of test bias voltages and the dark currents;
each of the plurality of processing circuits is further used for calculating a specific bias overvoltage of the sensor unit on the basis of the breakdown voltage and a specific bias voltage, and determining a gain of the sensor unit at the specific bias voltage on the basis of the specific bias overvoltage, wherein the specific bias voltage is an operating bias voltage;
each of the plurality of processing circuits is further used for correcting an energy $E_0$ of an effective event detected by the sensor unit according to the following formula:

$E=E_0*G_0/G,$ in which, E is the corrected energy, G is the gain of the sensor unit at the operating bias voltage, and $G_0$ is a predetermined constant.

* * * * *